(12) United States Patent
Carrilero et al.

(10) Patent No.: US 11,807,571 B2
(45) Date of Patent: Nov. 7, 2023

(54) SILICON AND SILICA NANOSTRUCTURES AND METHOD OF MAKING SILICON AND SILICA NANOSTRUCTURES

(71) Applicants: CORNING INCORPORATED, Corning, NY (US); ICFO, Barcelona (ES)

(72) Inventors: Albert Carrilero, Cardedeu (ES); Prantik Mazumder, Ithaca, NY (US); Valerio Pruneri, Castelldefels (ES)

(73) Assignees: Corning Incorporated, Corning, NY (US); ICFO, Barcelona (ES)

( * ) Notice: Subject to any disclaimer, the term of this patent is extended or adjusted under 35 U.S.C. 154(b) by 0 days.

(21) Appl. No.: 17/545,493

(22) Filed: Dec. 8, 2021

(65) Prior Publication Data

US 2022/0098094 A1 Mar. 31, 2022

Related U.S. Application Data

(60) Division of application No. 16/891,606, filed on Jun. 3, 2020, now Pat. No. 11,225,434, which is a
(Continued)

(51) Int. Cl.
*C30B 29/06* (2006.01)
*C03C 15/00* (2006.01)
(Continued)

(52) U.S. Cl.
CPC .............. *C03C 15/00* (2013.01); *C01B 33/12* (2013.01); *C30B 11/12* (2013.01); *C30B 29/06* (2013.01);
(Continued)

(58) Field of Classification Search
CPC ....... C30B 29/06; C30B 29/60; C30B 29/602; C30B 11/22; C01P 2004/13; C03C 15/00
See application file for complete search history.

(56) References Cited

U.S. PATENT DOCUMENTS 6,313,015 B1   11/2001   Lee et al.
7,638,345 B2   12/2009   Lee et al.
(Continued)

FOREIGN PATENT DOCUMENTS

EP   2133921 A1   12/2009
EP   2175053 A2   4/2010
EP   2317562 A1   5/2011

OTHER PUBLICATIONS

Al-Salman et al; "Template Assisted Electrodeposition of Germanium and Silicon Nanowires in an Ionic Liquid"; Physical Chemistry Chemical Physics; 2008, 10, 6233-6237.
(Continued)

*Primary Examiner* — Robert M Kunemund
(74) *Attorney, Agent, or Firm* — Svetlana Short; Irene L. Brookins

(57) ABSTRACT

Provided herein are methods for forming one or more silicon nanostructures, such as silicon nanotubes, and a silica-containing glass substrate. As a result of the process used to prepare the silicon nanostructures, the silica-containing glass substrate comprises one or more nanopillars and the one or more silicon nanostructures extend from the nanopillars of the silica-containing glass substrate. The silicon nanostructures include nanotubes and optionally nanowires. A further aspect is a method for preparing silicon nanostructures on a silica-containing glass substrate. The method includes providing one or more metal nanoparticles on a silica-containing glass substrate and then performing reactive ion etching of the silica-containing glass substrate under conditions that are suitable for the formation of one or more silicon nanostructures.

15 Claims, 5 Drawing Sheets

Related U.S. Application Data continuation of application No. 14/750,047, filed on Jun. 25, 2015, now abandoned.

(60) Provisional application No. 62/020,027, filed on Jul. 2, 2014.

(51) Int. Cl.

| | |
|---|---|
| *C30B 29/60* | (2006.01) |
| *C30B 29/18* | (2006.01) |
| *C30B 11/12* | (2006.01) |
| *C01B 33/12* | (2006.01) |

(52) U.S. Cl.
CPC .............. *C30B 29/18* (2013.01); *C30B 29/60* (2013.01); *C30B 29/602* (2013.01); *C01P 2004/13* (2013.01)

(56) References Cited

U.S. PATENT DOCUMENTS

| | | | |
|---|---|---|---|
| 7,985,666 | B2 | 7/2011 | Park et al. |
| 8,044,379 | B2 | 10/2011 | Wu |
| 8,143,143 | B2 | 3/2012 | Buchine et al. |
| 8,623,153 | B2 | 1/2014 | Pruneri et al. |
| 9,023,457 | B2 | 5/2015 | Carrilero et al. |
| 9,296,183 | B2 | 3/2016 | Baker et al. |
| 10,725,208 | B2 | 7/2020 | Alvine et al. |
| 11,225,434 | B2 * | 1/2022 | Carrilero ................ C30B 29/60 |
| 2006/0046480 | A1 | 3/2006 | Guo |
| 2007/0114387 | A1 | 5/2007 | Chang et al. |
| 2009/0325365 | A1 | 12/2009 | Park et al. |
| 2010/0084628 | A1 | 4/2010 | Lee et al. |
| 2012/0260983 | A1 | 10/2012 | Pruneri et al. |
| 2013/0149496 | A1 | 6/2013 | Mazumder et al. |
| 2014/0166092 | A1 | 6/2014 | Kozinsky et al. |

OTHER PUBLICATIONS

Alabi et al; "Silicon Oxide Nanowires: Facile and Controlled Large Area Fabrication of Vertically Oriented Silicon Oxide Nanowires for Photoluminescence and Sensor Applications"; Applied Materials & Interfaces; vol. 5, 2013; pp. 8932-8938.

Brault et al; "Chemical Physics of Fluorine Plasma-Etched Silicon Surfaces: Study of Surface Contaminations"; J. Appl. Phys. 68, (4); Aug. 15, 1990; pp. 1702-1709.

Esterina et al; "Synthesis of silicon oxide nanowires and nanotubes with cobalt-palladium or palladium catalysts" Journal of Applied Physics 112, Jun. 2012; 9 pages.

Fu et al. (Deep reactive ion etching as a tool for nanostructure fabrication, J. Vac. Sci. Technol. B 27(3)) (Year: 2009).

Jiang et al; "Medicinal Surface Modification of Silicon Nanowires: Impace on Calcification and Stromal Cell Proliferation"; Applied Materials & Interfaces; vol. 1, No. 2, 2009; pp. 266-269.

Jin Woo et al., "Hierarchical Nanostructure Produced by Growing Carbon Nanotubes on Silicon Oxide Nanowire", ECS Transactions, Jan. 1, 2009, pp. 991-996.

Jun et al., "Programmable Growth of Branched Silicon Nanowires Using a Focused Ion Beam", NANO Letters, vol. 10, No. 8, Aug. 11, 2010, pp. 2777-2782.

Kelzenberg et al; "Photovoltaic Measurements in Single-Nanowire Silicon Solar Cells" NANO Letters; 2008; vol. 8, No. 2; pp. 710-714.

Kolb et al; "On the Morphological Instability of Silicon/Silicon Dioxide Nanowires"; Appl. Phys. A. 80, 1405-1408 2005.

Morales et al; "A Laser Ablation Method for the Synthesis of Crystalline Semiconductor Nanowires"; Science; vol. 279; 1998; pp. 208-211.

Pan et al; "Molten Gallium as a Catalyst for the Large-Scale Growth of Highly Aligned Silica Nanowires"; J. Am. Chem. Soc., 2002, 124 (8), pp. 1817-1822.

Pan et al; "Temperature-Controlled Growth of Silicon-Based Nanostructures by Thermal Evaporation of SIO Powders"; J. Phys. Chem. B, 2001, 105; 2507-2514.

PCTUS2015038556 Search Report Dated Oct. 29, 2015.

Peng et al; "Fabrication of Large-Area Silicon Nanowire P—N Junction Diode Arrays"; Adv. Mater. 2004, 16, No. 1 Jan. 5; pp. 73-76.

Peng et al; "Silicon Nanowires for Rechargeable Lithium-Ion Battery Anodes"; Applied Physics Letters, 93, 033105 (2008); pp. 033105-1-033105-3.

Schmidt et al; "Large Area Fabrication of Leaning Silicon Nanopillars for Surface Enhanced Raman Spectroscopy"; Adv. Mater., 2012, 24, pp. OP11-OP18.

Schubert et al; "Silicon Nanowhiskers Grown on (111)Si Substrates By Molecular-Beam Epitaxy"; Applied Physics Letters; vol. 84, No. 24; Jun. 2004; pp. 4968-4970.

Sekhar et al; "Metal-Decorated Silica Nanowires: an Active Surface-Enhanced Raman Substrate for Cancer Biomarker Detection"; The Journal of Physical Chemistry C Letters; 2008, 112 pp. 1729-1734.

Shalek et al; "Vertical Silicon Nanowires as a Universal Platform for Delivering Biomolecules Into Living Cells"; PNAS; Feb. 2, 2010; vol. 107; No. 5; pp. 1870-1875.

Shir et al; "Oxidation of Silicon Nanowires"; J. Vac. Sci Technol. B; 24(3) May/Jun. 2006; pp. 1333-1336.

Taiwanese Patent Application No. 104121516, Office Action dated May 11, 2021, 1 page (English Translation Only) Taiwanese Patent Office.

Tsakalakos et al; "Silicon Nanowire Solar Cells"; Applied Physics Letters, 91; 233117 (2007) pp. 233117-1-233117-3.

Wagner et al.; "Vapor-Liquid-Solid Mechanism of Single Crystal Growth"; Applied Physics Letters vol. 4 No. 5, (1964); pp. 89-90.

Wang et al; "Transmission Electron Microscopy Evidence of the Defect Structure in Si Nanowires Synthesized by Laser Ablation"; Chemical Physics Letters, 283 (1998) 368-372.

Yang et al; "Templated-Assisted One-Dimensional Silica Nanotubes: Synthesis and Applications"; J. Mater. Chem. 2011, 21, pp. 6122-6135.

Zakharov et al; "Growth of Si Whiskers by MBE: Mechanism and Peculiarities"; Physica E Low Dimensionsl System and Nanostructures; vol. 37, Issue 1-2; Mar. 2007; pp. 148-152.

Zhang et al; "Silicon Nanowires Prepared by Laser Ablation at High Temperature"; Applied Physics Letters, vol. 72, No. 15; Apr. 1998; pp. 1835-1837.

* cited by examiner

SILICON AND SILICA NANOSTRUCTURES AND METHOD OF MAKING SILICON AND SILICA NANOSTRUCTURES

This is a divisional application of U.S. application Ser. No. 16/891,606, filed Jun. 3, 2020 now U.S. Pat. No. 11,225,434, which is a continuation application of U.S. application Ser. No. 14/750,047, filed Jun. 25, 2015, which in turn claims the benefit of priority under 35 U.S.C. § 119 of U.S. Provisional Application Ser. No. 62/020,027, filed on Jul. 2, 2014, the content of each of which is relied upon and incorporated herein by reference in its entirety.

BACKGROUND

The disclosure relates to silicon and silica nanostructures, and more particularly to silicon and silica nanotubes and nanowires. The disclosure also relates to a method of making silicon nanostructures by reactive ion etching of a silica-containing glass substrate and a method of making silica nanostructures by reactive ion etching of a silica-containing glass substrate to prepare silicon nanostructures and oxidation of the silicon nanostructures to produce silica nanostructures.

SUMMARY

One embodiment is a composition comprising one or more silicon nanostructures, such as silicon nanotubes, and a silica-containing glass substrate. As a result of the process used to prepare the silicon nanostructures, the silica-containing glass substrate comprises one or more nanopillars and the one or more silicon nanostructures extend from the nanopillars of the silica-containing glass substrate. The silicon nanostructures include nanotubes and optionally nanowires.

A further embodiment is a method for preparing silicon nanostructures on a silica-containing glass substrate. The method includes providing one or more metal nanoparticles on a silica-containing glass substrate and then performing reactive ion etching of the silica-containing glass substrate under conditions that are suitable for the formation of one or more silicon nanostructures. During the reactive ion etching process, the silica-containing glass substrate is etched in the regions surrounding the metal nanoparticles, the metal nanoparticles acting as an etching mask. Accordingly, the reactive ion etching results in a substrate having pillared structures under the metal nanoparticles. The metal nanoparticles also act as catalysts for the growth of silicon nanostructures. The result is a composition having silicon nanostructures extending from nanopillars that have been etched into the silica-containing glass substrate.

A further embodiment is a composition comprising one or more silica nanostructures, such as silica nanotubes, and a silica-containing glass substrate. As a result of the process used to prepare the nanostructures, the silica-containing glass substrate comprises one or more nanopillars and the one or more silica nanostructures extend from the nanopillars of the silica-containing glass substrate. The silica nanostructures include nanotubes and optionally nanowires.

A further embodiment is a method for preparing silica nanostructures on a silica-containing glass substrate. The method includes providing one or more metal nanoparticles on a silica-containing glass substrate and then performing reactive ion etching of the silica-containing glass substrate under conditions that are suitable for the formation of one or more silicon nanostructures. During the reactive ion etching process, the silica-containing glass substrate is etched in the regions surrounding the metal nanoparticles, the metal nanoparticles acting as an etching mask. Accordingly, the reactive ion etching results in a substrate having pillared structures under the metal nanoparticles. The metal nanoparticles also act as catalysts for the growth of silicon nanostructures. After the reactive ion etching process is complete, the silicon nanotubes are oxidized to form silica nanotubes. The result is a composition having silica nanostructures extending from nanopillars that have been etched into the silica-containing glass substrate.

A further embodiment is a method for preparing one or more silica nanotubes. The method includes providing one or more metal nanoparticles on a silica-containing glass substrate and then performing reactive ion etching of the silica-containing glass substrate under conditions that are suitable for the formation of one or more silicon nanotubes. The one or more silicon nanotubes are then oxidized to form one or more silica nanotubes. Prior to the oxidation, the silicon nanotubes may be removed from the silica-containing glass substrate.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Figure 1A:
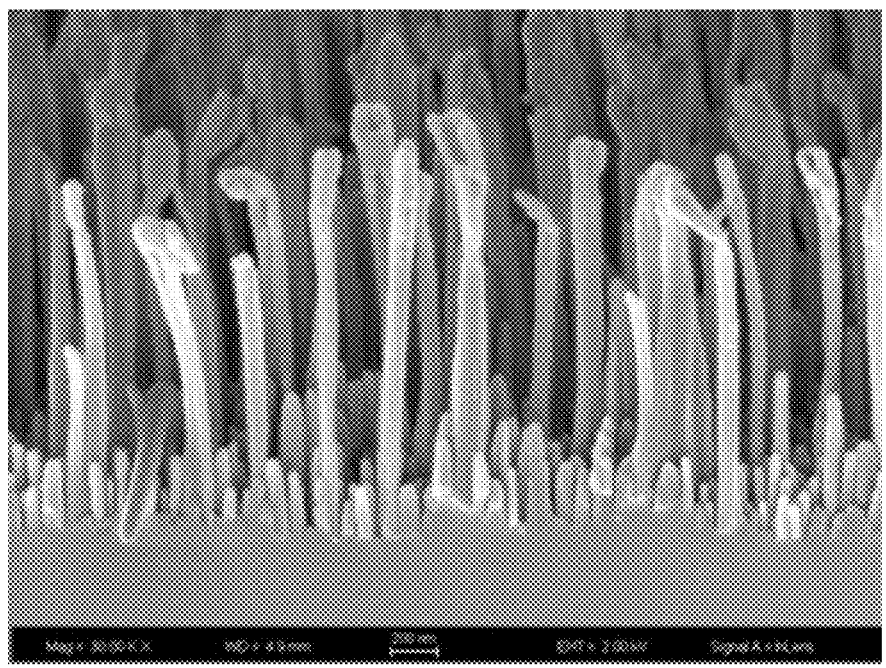
FIG. 1A is an SEM image of a cross-section of an embodiment of a composition comprising silicon nanostructures grown on a silica-containing glass substrate.

Reference will now be made in detail to the present preferred embodiment(s), examples of which are illustrated in the accompanying drawings. Whenever possible, the same reference numerals will be used throughout the drawings to refer to the same or like parts.

The engineering of materials at the nanometer scale has provided for a variety of new devices and electronic applications. Among the materials of great interest are silicon nanotubes and silicon nanowires. Due to their unique properties, silicon nanotubes and nanowires can be used in a variety of electronic, optoelectronic, electro-chemical, and electromechanical devices. In particular, silicon nanowires and nanotubes may be used in the preparation and manufacture of semiconductors. Silicon nanowires and nanotubes may also be used to create, among other things, photodetectors, photodiodes, photoluminescence devices, sensors, and rechargeable battery electrodes. And silicon nanowires and nanotubes may be doped with other elements in order to create devices having photoelectric or photovoltaic properties, such as solar cells.

Due to their biocompatibility, silicon nanowires and nanotubes can also be used as a biomaterial in medical or biological applications. For example, silicon nanowires or nanotubes can be used for the introduction of biomolecules, small molecules, nanoparticles, RNA, peptides, proteins, and the like into living cells. The efficiency of this delivery in some cases may be greater than 95%.

The preparation of silicon nanowires and nanotubes typically require the use of high temperatures, which adds significantly to the costs of production. Typical preparation processes also often involve the use of expensive techniques such as electron beam lithography or interference lithography. Using embodiments described herein, silicon nanotubes and nanowires may be fabricated without the use of high temperatures and without the use of expensive lithography processes. Accordingly, embodiments provide a low-cost method for the preparation of silicon nanotubes and nanowires.

Figure 1B:
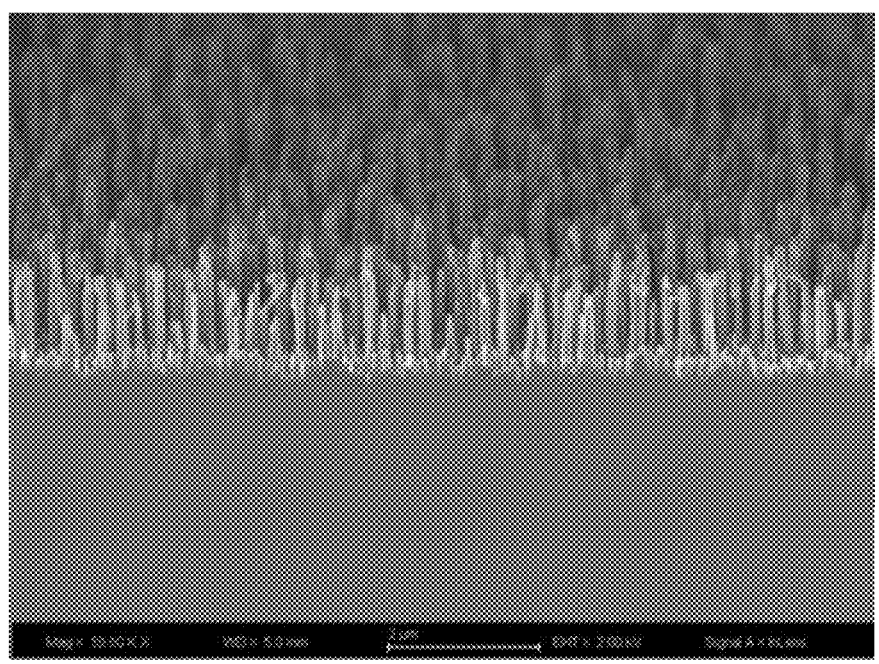
FIG. 1B is an SEM image of a cross-section of an embodiment of a composition comprising silicon nanostructures grown on a silica-containing glass substrate.
Figure 1C:
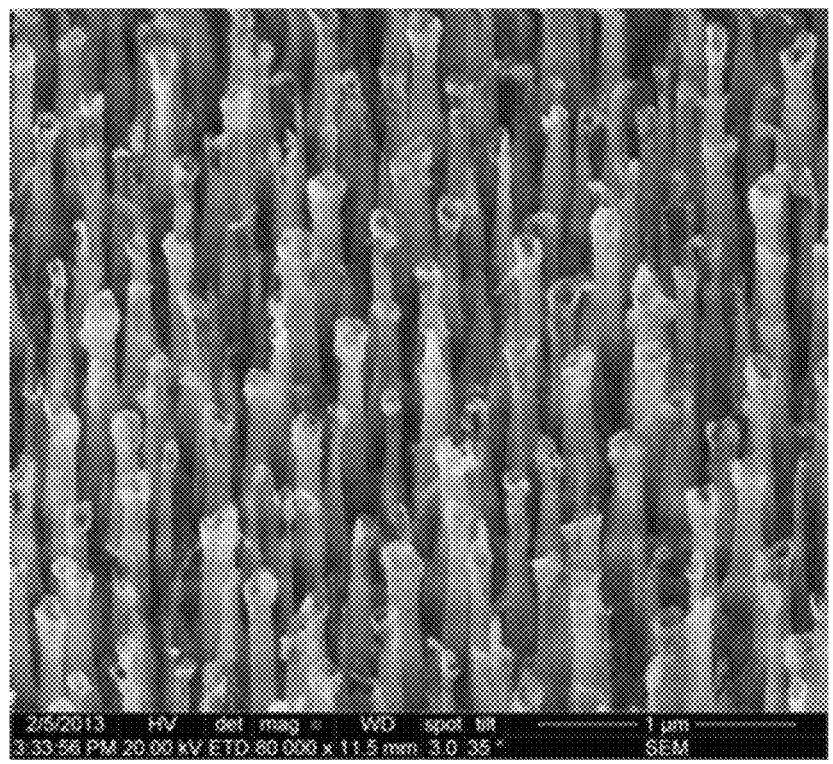
FIG. 1C is an SEM image of an embodiment of a composition comprising silicon nanostructures grown on a silica-containing glass substrate.
Figure 2:
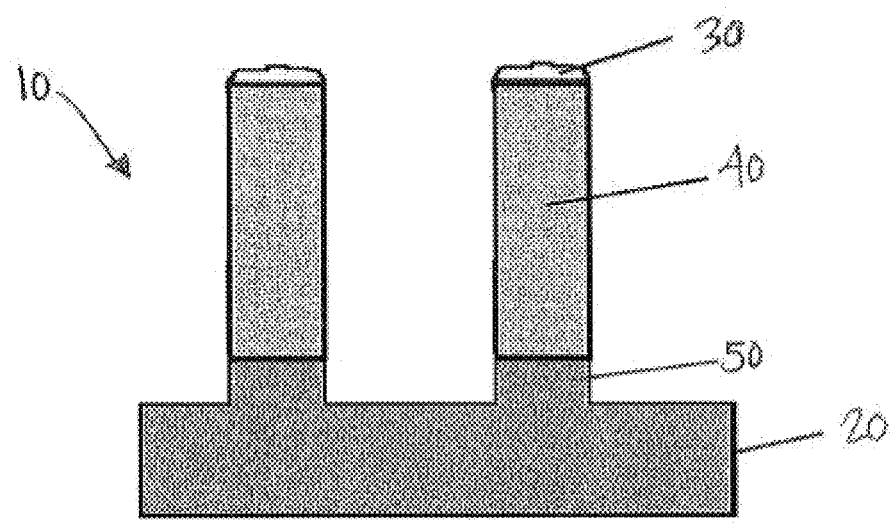
FIG. 2 is an illustration of a cross-section of an embodiment of a composition comprising silicon nanostructures grown on a silica-containing glass substrate.

Embodiments of the method produce a composition 10, such as that which is shown for example in FIG. 1A, FIG. 1B, and FIG. 1C. The composition 10 comprises silicon nanotubes and nanowires 40 extending from a silica-containing glass substrate 20. The structure of the composition 10 is also illustrated in FIG. 2, which shows the nanostructuring of the silica-containing glass substrate, which may be difficult to discern in FIGS. 1A through 1C. In alternative embodiments, the silicon nanotubes and/or nanowires 40 prepared as described herein may be removed from the substrate 20 on which they are grown and further treated or arranged to produce an article as would be understood by a person of ordinary skill. In yet other alternative embodiments, the composition 10 may be oxidized to convert the silicon nanotubes and/or nanowires 40 into silica nanotubes and/or nanowires. In yet other embodiments, the silicon nanotubes and/or nanowires 40 may be removed from the substrate 20 and oxidized to convert the silicon nanotubes and/or nanowires into silica nanotubes and/or nanowires.

In embodiments, silicon nanostructures including nanotubes and/or nanowires 40 are prepared through a process that involves reactive ion etching of a silica-containing glass substrate 20. The silica-containing glass substrate is first treated to provide metal nanoparticles 30 that are suitable to catalyze the nucleation and growth of the nanostructures 40 under the conditions that are present during the reactive ion etching of the silica-containing glass substrate 20.

Figure 3:
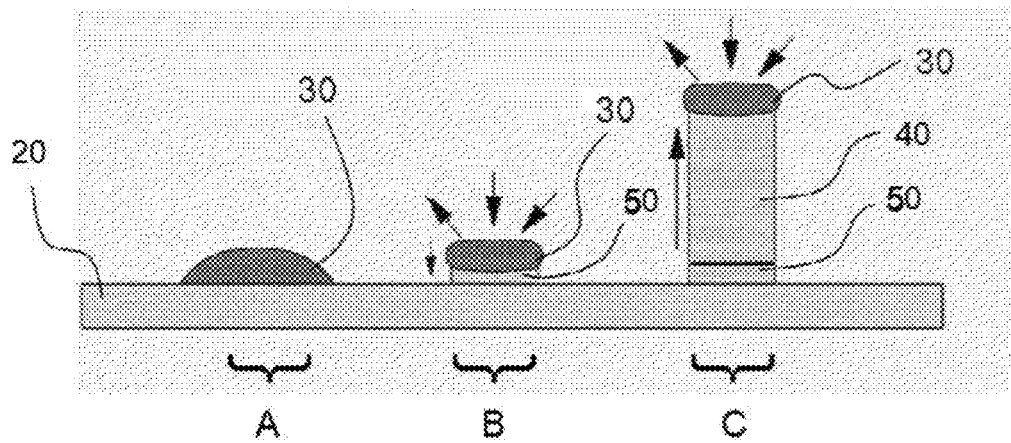
FIG. 3 is a diagram showing the growth of silicon nanostructures on a silica-containing glass substrate according to an embodiment of the reactive ion etching method.

FIG. 3, for example, illustrates the stages in the growth of silicon nanostructures 40 on a silica-containing glass substrate 20 according to an embodiment.

As a first step, a silica-containing glass substrate 20 is provided. In some embodiments, the silica-containing glass substrate comprises at least 70% silica, alternatively at least 75% silica, alternatively at least 80% silica, alternatively at least 85% silica, alternatively at least 90% silica, alternatively at least 95% silica. In some embodiments, the silica-containing glass substrate is fused silica glass. The other components of a silica-containing glass may be selected as would be understood by one of skill in the art and include, for example, sodium carbonate, calcium oxide, magnesium oxide, and aluminum oxide. In some embodiments, the silica-containing glass may comprise a commercially available glass, such as silicate glass, borosilicate glass, aluminosilicate glass, boroaluminosilicate glass, and the like.

In the step labeled Step A in FIG. 3, the silica-containing glass substrate 20 is treated to provide metal nanoparticles 30. The metal nanoparticles 30 are configured to be suitable for the growth of silicon nanotubes, silicon nanowires, or a combination thereof under the conditions of the later reactive ion etching step. The metal nanoparticles 30 may be deposited on the silica-containing glass substrate 20 by any manner known in the art to produce a plurality of discrete metal nanoparticles on a substrate.

In some embodiments, the metal nanoparticles 30 may be dewetted metal nanoparticles, such as may be prepared by the process described in U.S. patent application Ser. No. 13/687,208, the entirety of which is hereby incorporated by reference as if fully set forth below. Dewetted metal nanoparticles may be prepared by providing a substrate having a continuous ultra-thin metal-containing film (CUTMF) on a surface thereof and then dewetting the continuous ultra-thin metal-containing film to produce a plurality of discrete metal-containing dewetted islands on the surface of the substrate.

The CUTMF can be formed using a variety of techniques. In general, the CUTMF is not a free-standing film that can be applied (e.g., via an adhesive or other fastening means) to the surface of the substrate, but is, in fact, physically formed on the surface of the substrate. By way of example, the CUTMF can be fabricated using any of the variants of chemical vapor deposition (CVD) (e.g., plasma-enhanced CVD, aerosol-assisted CVD, metal organic CVD, and the like), any of the variants of physical vapor deposition (PVD) (e.g., ion-assisted PVD, pulsed laser deposition, cathodic arc deposition, sputtering, and the like), atomic layer deposition, spray coating, spin-coating, dip-coating, inkjetting, sol-gel processing, or the like. Such processes are known to those skilled in the art to which this disclosure pertains.

As stated above, the CUTMF must be at least "continuous" (i.e., it must comprise less than 1% of openings or void spaces in the area defined by its perimeter) and "ultra-thin" (i.e., it must have an average thickness of less than or equal to about 30 nm). In certain implementations, however, the CUTMF can have no openings or void spaces in the area defined by its perimeter. Similarly, in certain implementations, the CUTMF can have an average thickness of less than or equal to about 10 nm.

In some cases, the CUTMF-coated substrate can be subjected to an optional treatment in preparation for the dewetting step. Examples of such treatments include physical or chemical cleaning, physical or chemical strengthening, physical or chemical etching, physical or chemical polishing, annealing, sintering, shaping, and/or the like. Such processes are known to those skilled in the art to which this disclosure pertains.

Once the CUTMF has been disposed on at least a portion of the substrate, the CUTMF-coated substrate can be dewetted. The dewetting step involves subjecting the coated substrate to a thermal treatment that is sufficient to overcome the activation barrier against atomic diffusion in the continuous ultra-thin metal-containing film, such that the film breaks down into a plurality of discrete metal-containing islands.

The dewetting step can be carried out in a variety of conditions. For example, in certain implementations, the dewetting step will be performed while the sample is maintained under reduced pressure or vacuum conditions. In other implementations, the dewetting step can be performed under ambient pressure conditions. In addition to pressure, the atmosphere in which the CUTMF-coated substrate is maintained during the thermal treatment can be varied. That is, in certain implementations, a gas (other than air) can be flowed over the CUTMF-coated substrate during the thermal treatment. Such gases can include $O_2$, $N_2$, Ar, or the like.

Advantageously, the dewetting step described herein can make use of significantly lower temperatures and/or durations than existing dewetting technologies, while simultaneously producing smaller islands on the surface of the substrate. Specifically, the thermal treatment generally involves temperatures of less than or equal to about 700° C. In certain implementations, the thermal treatment involves temperatures of less than or equal to about 600° C. In other implementations, such as many of those where a film stack is used, the thermal treatment involves temperatures of less than or equal to about 200° C. With respect to timing, the thermal treatment generally takes less than or equal to about 1 hour. In certain implementations, the thermal treatment can be completed in less than or equal to about 10 minutes. In other implementations, the thermal treatment can be completed in less than or equal to about 30 seconds.

Those skilled in the art to which this disclosure pertains will recognize that a variety of temperatures, durations, pressures, and atmospheric conditions can be implemented during the thermal treatment of the dewetting step. By way of example, one specific dewetting step can involve heating a CUTMF-coated substrate in a furnace, which is held at about 1 atmosphere of pressure (i.e., ambient pressure) while an inert gas (e.g., $N_2$ or Ar) flows throughout the furnace, at a temperature of less than or equal to about 600° C. for about 30 seconds to about 2 minutes. In contrast, another specific dewetting step can involve heating a CUTMF-coated substrate in a vacuum furnace at a temperature of about 180° C. to about 500° C. for about 1 minute to about 1 hour.

As described in U.S. patent application Ser. No. 13/687,208, the size and pattern of the resulting metal nanoparticles may be tailored by control of the dewetting process parameters, such as the time, temperature, and atmosphere of the dewetting step. The dewetting process can be controlled, for example, in order to tailor the lateral dimension of the nanoparticles, the height of the nanoparticles, and/or the percentage of overall area of the substrate surface that is covered by the nanoparticles. For example, to achieve smaller average dimensions and/or larger density of the dewetted metal-containing islands, the average thickness of the CUTMFs can be decreased.

Although embodiments are described as having metal nanoparticles 30 formed by a dewetting process such as the one described above, it would be understood by a person of ordinary skill in the art that the silica-containing glass substrate 20 may be coated with one or more metal nanoparticles by any manner known in the art.

In some embodiments, the lateral cross-section of the metal nanoparticles may be controlled. For example, in some embodiments, the metal nanoparticles have an average longest lateral cross-sectional dimension between about 20 nm and about 300 nm, alternatively between about 25 nm and about 250 nm, alternatively between about 30 nm and about 200 nm. As used herein, the term "longest lateral cross-sectional dimension" refers to a particular dimension of an item or object that is parallel to the surface of the substrate. Thus, to clarify, when an object is circular, the longest lateral cross-sectional dimension is its diameter; when an object is oval-shaped, the longest lateral cross-sectional dimension is the longest diameter of the oval; and when an object is irregularly-shaped, the longest lateral cross-sectional dimension is the line between the two farthest opposing points on the perimeter of the object.

To ensure a good yield and density of silicon nanotubes, it may be desirable to have a large proportion of the metal nanoparticles having a longest lateral cross-sectional dimension within one of the ranges described above. For example, it may be desirable that at least about 60% of the metal nanoparticles have a longest lateral cross-sectional dimension between about 30 nm and about 200 nm, alternatively at least about 70%, alternatively at least about 75%, alternatively at least about 80%, alternatively at least about 85%, alternatively at least about 90%.

The metal to be used in the deposit of the metal nanoparticles may be selected from among those metals that are known to have a catalytic effect on the growth of silicon nanotubes and nanowires. For example, in some embodiments, the metal nanoparticles may comprise copper, nickel, gold, platinum, iron, titanium, aluminum, and combinations thereof. More desirably, the metal nanoparticles may comprise copper, nickel, gold, or combinations thereof. The metal nanoparticles may comprise a metal in its elemental form or a metal that is a constituent of an alloy.

Next, the silica-containing glass substrate 20 comprising metal nanoparticles 30 is subjected to a reactive ion etching procedure. Reactive ion etching of the silica-containing glass substrate 20 comprising metal nanoparticles 30 causes a number of things to occur at substantially the same time. First, reactive ion etching results in the formation of nanopillars 50 in the silica-containing glass substrate 20. As the surface of the silica-containing glass substrate 20 is etched, the metal nanoparticles 30 act as an etching mask by preventing the etching of the substrate surface. Accordingly, the substrate 20 is etched to form valleys around the metal nanoparticles 30. And, as the reactive ion etching progresses, each metal nanoparticle 30 becomes located at the top of a nanopillar 50. The formation of a nanopillar 50 is illustrated in FIG. 3, at Step B.

The formation of a nanostructured substrate comprising nanopillars by reactive ion etching of a substrate having a surface coated with metal dewetted nanoparticles is described, for example, in U.S. patent application Ser. No. 13/687,227, the entirety of which is hereby incorporated by reference as if fully set forth below.

At the same time, the reactive ion etching causes the growth of silicon nanotubes and/or nanowires 40. Reactive ion etching of the silica-containing glass substrate 20 releases ionized silicon-based compounds from the surface of the substrate into the area immediately above the substrate. Without being bound by theory, it is believed that the ionized silicon-based compounds comprise $SiO_2$, $Si-Si_3F$, $Si-F_4$, and $Si-OF_3$. The ionized silicon-based compounds react in the presence of the metal nanoparticle catalyst 30 to form and grow silicon nanotubes and/or nanowires 40. The nanotubes and nanowires 40 extend substantially vertically from the nanopillars 50 of the etched substrate 20, as is demonstrated for example in FIGS. 1A through 1C. The formation of the nanotubes and/or nanowires 40 is illustrated in FIG. 3, at Step C.

It is believed that the growth of the silicon nanotubes and nanowires occurs in a "bottom-up" manner, as illustrated in FIG. 3. As such, the metal nanoparticle 30 will typically be located at the top of the silicon nanotube or silicon nanowire 40. However, it is also contemplated that the growth of the silicon nanotubes and nanowires may, in some instances, take place in a "top-down" manner, whereby the metal nanoparticle 30 would be located on the top surface of the nanopillar 50 and at the bottom end of the silicon nanotube or nanowire 40.

The diameter of the silicon nanotubes and/or nanowires 40 is largely a function of the size of the metal nanoparticle 30 catalysts. Accordingly, the diameters of the silicon nanotubes and/or nanowires 40 can be selected through control over the process by which the metal nanoparticles 30 are formed. Where, for example, the metal nanoparticles 30 are prepared through a dewetting process, the lateral dimension of the dewetted metal nanoparticles may be controlled as described above and in U.S. patent application Ser. No. 13/687,208, which is incorporated herein by reference.

Without being bound by theory, it is believed that a metal nanoparticle 30 having a certain minimum particle size is necessary in order to be effective for the catalytic growth of silicon nanotubes and/or nanowires 40. FIG. 1A, for example, is an SEM image of a cross-section of silicon nanotubes and nanowires 40 made by reactive ion etching of a fused silica glass substrate 20 containing metal dewetted metal nanoparticles 30. The image illustrates the growth of silicon nanotubes and nanowires 40 on certain nanopillars 50, which correspond to the larger metal nanoparticles 30. The smaller metal nanoparticles 30 result in the etching of smaller nanopillars 50, as would be expected, but the nanopillars having smaller lateral dimensions do not provide for the growth of silicon nanotubes or nanowires 40.

The silicon nanotubes and/or nanowires may have an average diameter between about 20 nm and about 300 nm, alternatively between about 25 nm and about 250 nm, alternatively between about 30 nm and about 200 nm. In some embodiments, at least about 60% of the silicon nanotubes and nanowires have a diameter between about 30 nm and about 200 nm, alternatively at least about 70%, alternatively at least about 75%, alternatively at least about 80%, alternatively at least about 85%, alternatively at least about 90%.

Typically, the silicon nanostructures having smaller diameters are more likely to take the form of silicon nanowires and the silicon nanostructures having larger diameters are more likely to take the form of silicon nanotubes. Accordingly, one may also control the ratio of nanotubes to nanowires through control over the sizes of the metal nanoparticle catalysts. In some embodiments, at least about 60% of the silicon nanostructures are nanotubes, alternatively at least about 70%, alternatively at least about 80%, alternatively at least about 90%, and alternatively at least about 95%.

The length of the silicon nanotubes and/or nanowires 40 on the other hand is largely a function of the reactive ion etching process, specifically the conditions that are applied during the etching and the length of time that the etching process is performed. In some embodiments, the silicon nanotubes and/or nanowires may have an average height between about 30 nm and about 2500 nm, alternatively between about 40 nm and about 2250 nm, and alternatively between about 40 nm and about 2000 nm.

The packing of the silicon nanotubes and/or nanowires on the surface of the silica-containing glass substrate may be controlled by control over the placement and sizes of the metal nanoparticle catalysts. In some embodiments, the silicon nanotubes and nanowires may have a surface density of at least $10^8$ $cm^{-2}$, alternatively at least $10^9$ $cm^{-2}$, alternatively at least $10^{10}$ $cm^{-2}$.

The reactive ion etching can be performed under a variety of conditions that are suitable for the etching of silica-containing glass substrate, the ionization of the silicon-based compounds, and the growth of the silicon nanotubes and/or nanowires by reaction of the silicon-based compounds with the metal catalysts.

The reactive ion etching step generally involves subjecting at least a portion of the surface of the substrate on which the plurality of discrete metal nanoparticles are disposed to a plasma of gases. The plasma of gases can etch by chemically reacting with the uncovered portions of the surface of the substrate and/or physically bombarding the uncovered portions of the surface of the substrate. The plasma of gases may be formed, for example, by an inductively coupled plasma generator (ICP) system.

In some embodiments, the etching may also serve to reduce the dimensions of the metal nanoparticles. For example, the plasma of gases can also etch the discrete metal nanoparticles. While the plasma of gases preferentially etches the uncovered portions of the surface of the substrate over the discrete metal nanoparticles, it is contemplated that intense etching conditions may result in a reduction in the size of the metal nanoparticles or even in the consumption of the metal nanoparticles altogether. The reduction and/or consumption of the metal particles during the reactive ion etching process may be particularly desirable in some instances because it increases the optical transparency of the final composition without requiring a separate metal-removal process.

One illustrative type of plasma gases comprises a fluorine source (e.g., $CHF_3$, $CF_4$, $SF_6$, or the like) that can be used to chemically react with and/or bombard at least Si-containing substrate components. A second illustrative plasma of gases comprises a fluorine source and a chlorine source (e.g., $BCl_3$, $F_2$, or the like), such that the fluorine source can be used to chemically react with and/or bombard Si-containing substrate components and the chlorine source can be used to selectively react with and/or bombard other substrate components, such as Al, Na, Ga, or K-containing substrate components among others. Another illustrative plasma of gases comprises argon or $N_2$ that can be used to physically bombard a variety of substrate components. Yet another illustrative plasma of gases comprises a fluorine source, a chlorine source, and argon. Still another illustrative plasma of gases comprises one or more fluorine sources and argon.

By adjusting the ratios of the components of the plasma of gases, the flow of the plasma of gases, the duration of the exposure to the plasma of gases, the temperature of the sample, and/or the ambient pressure, compositions 10 having different depths of nano-pillars 50 and lengths of silicon nanotubes and nanowires 40 can be achieved.

For example, a silica-containing glass substrate 20 comprising dewetted metal nanoparticles 30 may be disposed inside an RIE vacuum chamber. Reaction gasses, such as a mixture of $CHF_3$, $SF_6$, and argon, may then be injected into the chamber. A plasma may be generated by the application of either RF or RF together with ICP power. The RF power is generally at least about 10 W and, when employed, the ICP power is generally at least about 50 W.

The temperature within the chamber during the reactive ion etching process may be controlled to be about 350° C. or less, alternatively about 300° C. or less, alternatively about 250° C. or less, alternatively about 200° C. or less, alternatively about 150° C. or less, alternatively about 100° C. or less, alternatively about 75° C. or less, or alternatively about 50° C. or less. In some embodiments, the reactive ion etching may be performed at room temperature, e.g. about 20° C., or lower. The formation of silicon nanotubes and/or nanowires 40 using a low temperature reactive ion etching process offers large cost benefits over conventional methods, which typically require high temperature treatments.

The pressure within the chamber during the reactive ion etching process may be, for example, between about 1 mTorr to about 200 mTorr, alternatively about 2 mTorr to about 175 mTorr, alternatively about 3 mTorr to about 150 mTorr, alternatively about 4 mTorr to about 125 mTorr, and alternatively about 5 mTorr to about 100 mTorr.

The length of the etching process will generally depend on the desired lengths of silicon nanostructures 40 and the etching conditions being applied, e.g. the power used to generate the plasma and the conditions within the chamber (i.e. the temperature and pressure). The etching process may generally be carried out for a period of time between about one minute and about 60 minutes.

EXAMPLES

Various embodiments will be further clarified by the following examples.

Example 1

In this example, a fused silica substrate was treated to provide discrete nickel nanoparticles on the surface of the substrate. The nickel nanoparticles are suitable for catalysis of the growth of silicon nanotubes and nanowires using the reactive ion etching method described above. The substrates chosen were about 1 inch by about 1 inch squares of flat fused silica glass.

The deposition of the Ni CUTMFs was carried out using a rapid thermal annealing (RTA) system (e.g., Tsunami™ RTP-600S) at a temperature of about 750° C., typically for about 50 to 125 seconds, and using the procedures described in European Patent No. 2133921 A1 and European Patent Application No. 09382238.5, which are both incorporated herein by reference as if fully set forth below. The as-deposited Ni films had an average thickness of about 8 nm.

After the CUTMFs were formed, each sample was independently maintained in the sample holder of the rapid thermal annealing system for the dewetting step. The samples were heated to about 750° C., at a rate of about 30° C. per second. The samples were held at about 750° C. for about 125 seconds. The samples were subsequently allowed to cool to about 50° C., at which point they were removed from the sample chamber. High purity $N_2$ gas was used to prevent oxidation of the metal film.

Example 2

In this example, a masked glass surface was dry etched using a reactive ion etching (RIE) process to produce a textured glass article.

A glass surface comprising discrete nickel nanoparticles produced in accordance with EXAMPLE 1 above was placed in a RIE chamber (Plasmalab System 100 ICP180, Oxford Instruments) equipped with a 4 inch diameter clamping plate. Reactive ion etching was then carried out using the parameters shown in Table 1 below.

TABLE 1

| | |
|---|---|
| Time (min.) | 15 |
| $CHF_3$ (sccm) | 5 |
| $SF_6$ (sccm) | 15 |
| Argon (sccm) | 30 |
| RF Power (W) | 30 |
| ICP Power (W) | 600 |
| Temperature (° C.) | 10 |
| Pressure (mTorr) | 10 |

A composition comprising silicon nanotubes and nanowires extending substantially vertically from the top of nanopillars on a textured glass substrate was obtained.

Figure 4:
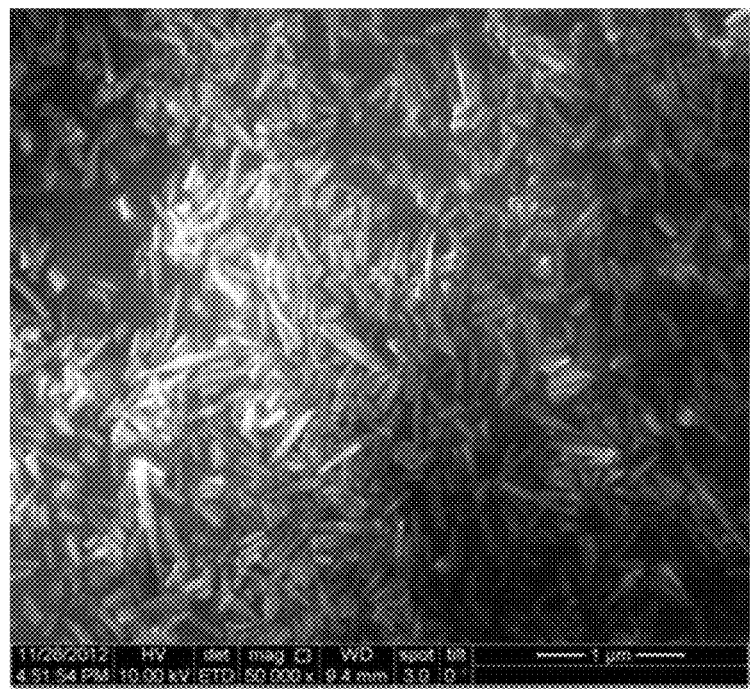
FIG. 4 is an SEM image of silicon nanotubes and nanowires prepared according to an embodiment of the reactive ion etching method and removed from the silica-containing glass substrate.
Figure 5:
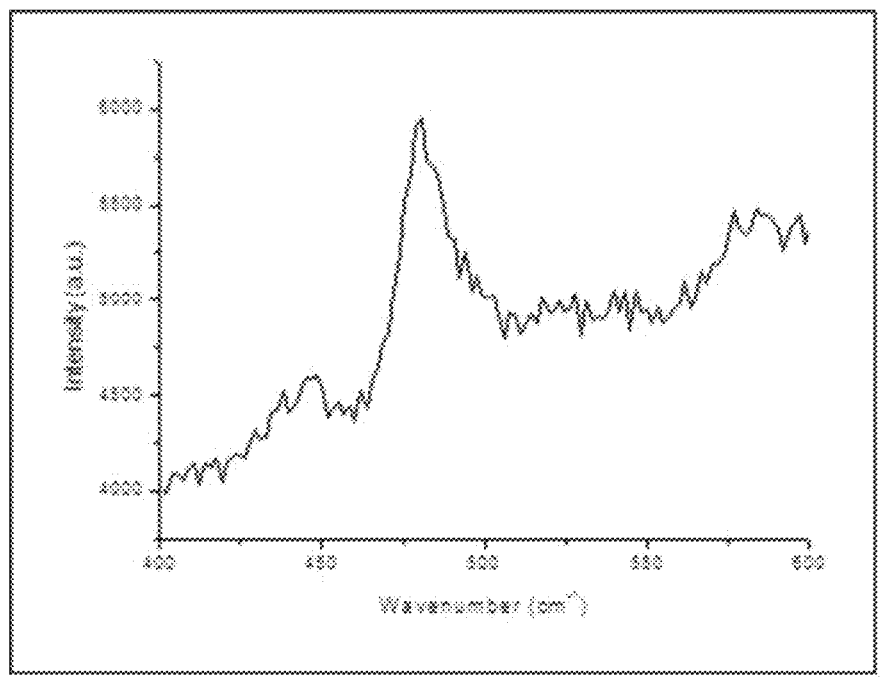
FIG. 5 is a Raman spectroscopy spectrum of silicon nanotubes and nanowires prepared according to an embodiment of the reactive ion etching method.

The structure of the silicon nanotubes and/or nanowires was confirmed through a variety of testing. For example, the silicon nanotubes and nanowires produced according to the method described above were broken off of the glass substrate, as illustrated in FIG. 4. The silicon nanotubes and nanowires were then subjected to Raman spectroscopy. The results are shown in FIG. 5. The results show a Raman broad band peak centered at about 480 $cm^{-1}$, which is indicative of amorphous silicon. Accordingly, the results of the Raman spectroscopy of the nanotubes and nanowires prepared in accordance with embodiments demonstrate that the nanotubes and nanowires consist of an amorphous silicon structure.

Figure 6:
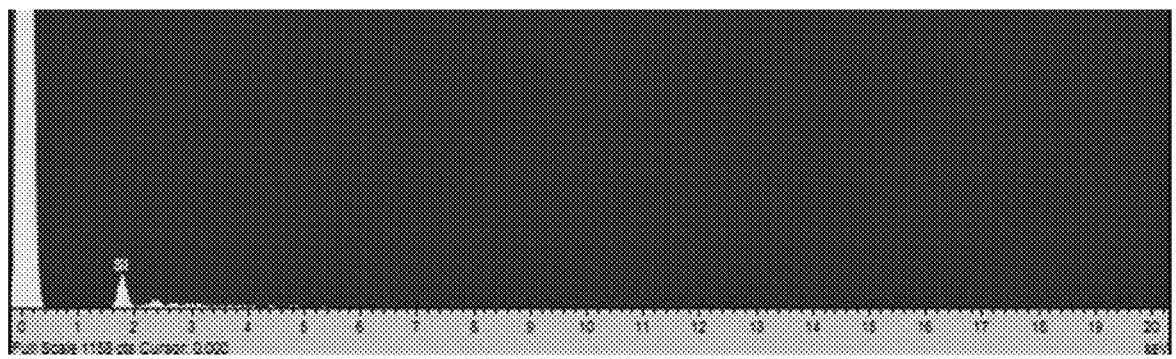
FIG. 6 is an energy dispersive x-ray spectroscopy (EDX) spectrum of silicon nanotubes and nanowires prepared according to an embodiment of the reactive ion etching method and removed from the silica-containing glass substrate.

The silicon nanotubes and nanowires produced according to the method described above and broken from the glass substrate were also subjected to Energy Dispersive X-ray spectroscopy (EDX). The results are shown in FIG. 6. Elementary analysis of the EDX spectrum confirms that the nanotubes and nanowires prepared in accordance with embodiments contain only silicon.

Figure 7:
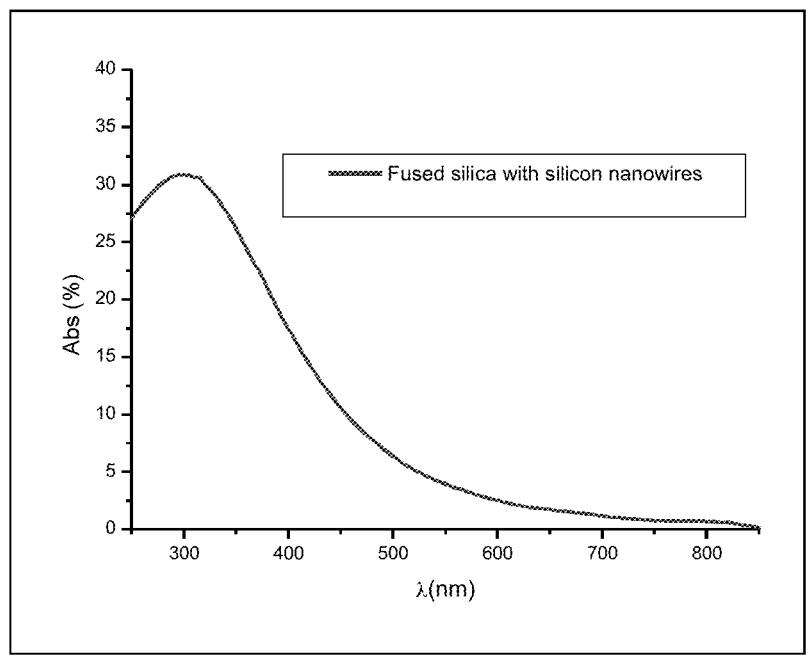
FIG. 7 is an ultraviolet-visible absorption spectroscopy (UV-Vis) spectrum of silicon nanotubes and nanowires prepared according to an embodiment of the reactive ion etching method.

The silicon nanotubes and nanowires produced according to the method described above were also tested without being removed from the glass substrate. For example, the silicon nanotubes and nanowires grown from a fused silica glass substrate were tested via ultraviolet-visible spectroscopy. The results are shown in FIG. 7. The composition comprising the silicon nanotubes and nanowires grown from a fused silica glass substrate was found to have a high absorption in the UV range, with a maximum peak ($\lambda_{max}$) centered at about 300 nm. The absorbance spectrum is indicative of silicon, confirming the growth of silicon nanotubes and nanowires from the fused silica glass substrate.

The preparation of silicon nanotubes and/or nanowires using reactive ion etching of a silica-containing glass substrate provides certain advantages over other known methods for the preparation of silicon nanotubes and nanowires. The silicon source for the growth of the silicon nanostructures is a silica-containing glass substrate, which is an inexpensive source of silicon compared to gaseous sources that may be required in other methods. The reactive ion etching may also be performed at low temperatures, including for example at room temperature, and without the need for expensive lithography techniques, thereby cutting out a major cost of many nanotube production methods.

In some embodiments, the silicon nanotubes and/or nanowires 40 may be removed from the substrate 20. Once removed, the silicon nanotubes and/or nanowires 40 may be treated to remove any remaining metal nanoparticles 30, as would be understood by a person of skill in the art. Once removed, the silicon nanotubes and/or nanowires may also be oxidized to prepare silica nanotubes and/or nanowires.

However, the composition 10 prepared by reactive ion etching of silica-containing glass substrate and comprising silicon nanotubes and/or nanowires may also provide a glass substrate with a textured surface having several advantages. Using the methods described above, silicon nanotubes and/or nanowires may be grown directly from a glass substrate, such as a transparent glass substrate. Additionally, as noted above, the reactive ion etching process may be controlled so as to effectively reduce the amount of metal catalyst that remains on the silicon nanotube and nanowire structures. Thus, silicon nanotubes and/or nanowires having a high optical transparency can be prepared without the need for a separate metal removal process.

In some embodiments, once the reactive ion etching step is complete, the remaining metal nanoparticles can optionally be removed or separated from the silicon nanotubes and/or nanowires. This can be done, for example, by solubilizing the plurality of metal nanoparticles or by acid etching to remove the metal. Those skilled in the art to which this disclosure pertains can readily select appropriate chemicals and parameters for this step without undue experimentation. Removal of the metal nanoparticles may be particularly desirable, for example, in order to increase the transparency of the silicon nanotubes and/or nanowires.

Accordingly, the composition 10 may provide a textured glass having high optical transparency.

In some embodiments, the silicon nanotubes and nanowires may also provide the composition 10 with strong antireflection properties, due to a more gradual change of refractive index at the surface of the glass. Accordingly, the composition 10 comprising silicon nanotubes and/or nanowires 40 extending from a glass substrate 20 may be configured to provide the glass surface with an antireflection coating. Antireflection coatings are used to reduce the optical reflection of surfaces, including glass surfaces. For example, the composition 10 comprising silicon nanotubes and/or nanowires 40 extending from a glass substrate 20 may be useful as a graded index antireflection material.

In some embodiments, the composition 10 comprising silicon nanotubes and/or nanowires 40 extending from a glass substrate 20 may also be rendered hydrophobic and/or oleophobic, such as by application of a hydrophobic and/or oleophobic coating. The hydrophobic and/or oleophobic coating may comprise, for example, a fluorosilane coating such as the Dow Corning® 2634 Coating (available from the Dow Corning Corporation), which comprises alkoxysilane functional perfluoropolyether (PFPE) hybrid polymers, or Trichloro (1H, 1H, 2H, 2H-perfluorooctyl). The hydrophobic and/or oleophobic coating can be applied by conventional methods, such as dipping or evaporation. After application of a fluorosilane coating to an embodiment of the composition 10, the surface of the composition was demonstrated to have a contact angle of about 172 degrees when measured using water and a contact angle of about 114 degrees when measuring using oleic acid.

The term "oleophobic" is used herein to refer to a material that imparts a wetting characteristic such that the contact angle between oleic acid and a surface formed from the material is greater than 90 degrees. Analogously, the term "hydrophobic" is used herein to refer to a material that imparts a wetting characteristic such that the contact angle between water and a surface formed from the material is greater than 90°. Because the surface may be both hydrophobic and oleophobic, it may be useful in fingerprint resistant touch screen applications, such as is described in U.S. patent application Ser. No. 13/693,379, the entirety of which is hereby incorporated by reference as if fully set forth below.

In some embodiments, the silicon nanotubes and/or nanowires may be subjected to an oxidation step such that the silicon nanostructures are at least partially oxidized to form silica nanostructures. The oxidation step generally involves subjecting the silicon nanotubes and/or nanowires disposed on the surface of the substrate to an oxidant gas (e.g., $O_2$, $O_3$, $NO_2$, or the like). The oxidation step can be carried out in the presence of absence of heat. Because the silicon nanotubes are so thin, the oxidation may occur at moderate temperatures and under neutral oxygen fluxes. In some embodiments, removal of the silicon nanotubes and/or nanowires form the silica-containing glass substrate may be performed prior to oxidation to form silica nanotubes and/or nanowires. In other embodiments, the oxidation may be performed immediately after the preparation of the silicon nanotubes and/or nanowires.

The sizes, e.g. diameters and lengths, of the silica nanotubes and nanowires may generally be substantially equivalent to the diameters and lengths of the silicon nanotubes and/or nanowires prior to oxidation, as previously described. Similarly, where the silica nanotubes and nanowires extend from nanopillars on the substrate to provide a glass substrate with a textured surface, the surface density of the silica nanotubes and nanowires on the substrate may be substantially equivalent to the surface density of the silicon nanotubes and nanowires prior to oxidation, as previously described.

Oxidation of the silicon nanotubes and/or nanowires to provide silica nanotubes and/or nanowires may be particularly desirable in order to increase the transparency of the nanostructures. The transparency of silica nanotubes over the entire visible spectrum may be at least about 75%, alternatively at least about 80%, alternatively at least about 85%, alternatively at least about 90%. As described above, the glass substrate, from which the silica nanostructures may extend, may also provide a high degree of transparency. As such, a composition comprising the silica nanotubes and/or nanowires extending from a surface of the silica-containing glass substrate may have a transparency over the entire visible spectrum of at least about 70%, alternatively at least about 75%, alternatively at least about 80%, alternatively at least about 85%, alternatively at least about 90%. Accordingly, the composition may provide a textured glass having high optical transparency.

In some embodiments, the silica nanotubes and nanowires may also provide the composition with strong antireflection properties, due to a more gradual change of refractive index at the surface of the glass. Accordingly, the composition comprising silica nanotubes and/or nanowires extending from a glass substrate may be configured to provide the glass substrate with an antireflection coating. Antireflection coatings are used to reduce the optical reflection of surfaces, including glass surfaces. For example, the composition comprising silica nanotubes and/or nanowires may be useful as a graded index antireflection material.

In some embodiments, the composition comprising silica nanotubes and/or nanowires extending from a glass substrate may also be rendered hydrophobic and/or oleophobic, such as by application of a hydrophobic and/or oleophobic coating. Because the surface may be both hydrophobic and oleophobic, as well as having high optical transparency, the textured glass may be useful in fingerprint resistant touch screen applications and other applications where such a combination of properties would be desirable.

Finally, the entire process of ultrathin metal film deposition, dewetting into metal nanoparticles, reactive ion etching of the silica-containing glass to grow silicon nanotubes and/or nanowires, and oxidation of the silicon nanotubes and nanowires to transparent silica nanotubes and nanowires does not require any expensive raw materials, lithography, or high temperature processes. Accordingly, the entire process is industrially scalable.

It will be apparent to those skilled in the art that various modifications and variations can be made without departing from the spirit or scope of the aspects described herein.

What is claimed is:

1. A composition comprising:
    a plurality of silicon nanostructures; and
    a silica-containing glass substrate, the silica-containing glass substrate comprising a plurality of nanopillars etched into a surface of the silica-containing glass substrate, the plurality of nanopillars comprising different depths in the silica-containing glass substrate;
    wherein the plurality of silicon nanostructures extend from the plurality of nanopillars of the silica-containing glass substrate; and
    wherein the plurality of silicon nanostructures comprise one or more nanotubes.

2. The composition of claim 1, wherein the silica-containing glass substrate is fused silica glass.

3. The composition of claim 1, wherein the plurality of silicon nanostructures have external diameters between about 30 nm and about 200 nm.

4. The composition of claim 1, wherein the plurality of silicon nanostructures have lengths between about 50 nm and about 2000 nm.

5. The composition of claim 1, wherein the plurality of silicon nanostructures have a surface density on the silica-containing glass substrate of at least $10^{10}$ cm$^{-2}$.

6. The composition of claim 1, wherein plurality of the silicon nanostructures are coated with a hydrophobic and/or oleophobic coating.

7. A composition comprising:
    one or more silica nanostructures; and
    a silica-containing glass substrate, the silica-containing glass substrate comprising one or more nanopillars comprising different depths etched into a surface of the silica-containing glass substrate;
    wherein the silica nanostructures extend from the nanopillars of the silica-containing glass substrate; and
    wherein the silica nanostructures comprise one or more nanotubes.

8. The composition of claim 7, wherein the silica nanostructures also comprise nanowires.

9. The composition of claim 7, wherein the silica nanostructures are substantially transparent.

10. The composition of claim 7, wherein the silica nanostructures have external diameters between about 30 nm and about 200 nm.

11. The composition of claim 7, wherein the silica nanostructures have lengths between about 50 nm and about 2000 nm.

12. A method for preparing the composition of claim 7, the method comprising the steps of:
    providing one or more metal nanoparticles on the surface of the silica-containing glass substrate;
    performing reactive ion etching on the surface of the silica-containing glass substrate under conditions suitable for the formation of silicon nanostructures comprising silicon nanotubes using the one or more metal nanoparticles as an etching mask; and
    oxidizing the silicon nanostructures to form the one or more silica nanostructures.

13. A method for preparing a silica nanotube comprising the steps of:
    providing one or more metal nanoparticles on a silica-containing glass substrate;
    performing reactive ion etching of the silica-containing glass substrate under conditions suitable for the formation of a silicon nanotube; and
    oxidizing the silicon nanotube to form a silica nanotube.

14. The method of claim 13 further comprising the step of removing the silicon nanotube from the silica-containing glass substrate prior to oxidation.

15. The composition of claim 1, wherein the plurality of silicon nanostructures consist of amorphous silicon.

* * * * *

UNITED STATES PATENT AND TRADEMARK OFFICE
CERTIFICATE OF CORRECTION

| | | |
|---|---|---|
| PATENT NO. | : 11,807,571 B2 | Page 1 of 1 |
| APPLICATION NO. | : 17/545493 | |
| DATED | : November 7, 2023 | |
| INVENTOR(S) | : Albert Carrilero et al. | |

It is certified that error appears in the above-identified patent and that said Letters Patent is hereby corrected as shown below:

On the Title Page

On the page 2, in Column 1, under Item (56) "Other Publications", Line 14, delete "Impace" and insert -- Impact --.

On the page 2, in Column 2, under Item (56) "Other Publications", Line 53, delete "Dimensionsl" and insert -- Dimensional --.

Signed and Sealed this
Twelfth Day of November, 2024

Katherine Kelly Vidal
*Director of the United States Patent and Trademark Office*